United States Patent [19]

Browne

[11] Patent Number: 5,695,847

[45] Date of Patent: Dec. 9, 1997

[54] THERMALLY CONDUCTIVE JOINING FILM

[76] Inventor: James M. Browne, 21 Pillon Reef, Pleasant Hill, Calif. 94523

[21] Appl. No.: 676,643

[22] Filed: Jul. 10, 1996

[51] Int. Cl.$^6$ ..................................................... B32B 5/12
[52] U.S. Cl. ........................ 428/112; 428/378; 428/381; 428/388; 428/389
[58] Field of Search ....................... 428/112, 378, 428/381, 388, 389

[56] References Cited

U.S. PATENT DOCUMENTS

| | | | |
|---|---|---|---|
| H1332 | 7/1994 | Deakyne et al. | 428/290 |
| 3,462,340 | 8/1969 | Hough | 161/59 |
| 3,930,916 | 1/1976 | Shelley | 156/71 |
| 3,982,320 | 9/1976 | Buchoff et al. | 29/630 |
| 4,065,592 | 12/1977 | McAllister | 428/92 |
| 4,065,593 | 12/1977 | Peterson | 428/92 |
| 4,199,637 | 4/1980 | Sado | 428/119 |
| 4,210,895 | 7/1980 | Sado et al. | 338/99 |
| 4,252,391 | 2/1981 | Sado | 339/60 R |
| 4,252,990 | 2/1981 | Sado | 174/52 R |
| 4,321,033 | 3/1982 | Eddy et al. | 432/60 |
| 4,408,814 | 10/1983 | Takashi et al. | 339/59 M |
| 4,449,774 | 5/1984 | Takashi et al. | 339/59 M |
| 4,485,429 | 11/1984 | Mittal | 361/386 |
| 4,486,490 | 12/1984 | Patz et al. | 428/245 |
| 4,520,562 | 6/1985 | Sado et al. | 29/878 |
| 4,603,731 | 8/1986 | Olsen | 165/41 |
| 4,729,166 | 3/1988 | Lee et al. | 29/877 |
| 4,752,415 | 6/1988 | Iwaskow et al. | 252/511 |
| 4,754,546 | 7/1988 | Lee et al. | 29/877 |
| 4,810,677 | 3/1989 | Heinze et al. | 501/95 |
| 4,849,858 | 7/1989 | Grapes et al. | 361/388 |
| 4,867,235 | 9/1989 | Grapes et al. | 165/185 |
| 4,874,548 | 10/1989 | Hajovsky | 252/511 |
| 4,882,089 | 11/1989 | Iwaskow et al. | 428/242 |
| 4,888,247 | 12/1989 | Zweben et al. | 428/105 |
| 4,954,873 | 9/1990 | Lee et al. | 357/72 |
| 4,983,456 | 1/1991 | Iwaskow et al. | 428/254 |
| 4,990,402 | 2/1991 | Kneringer et al. | 428/408 |
| 5,002,715 | 3/1991 | Grapes et al. | 256/162 |
| 5,026,748 | 6/1991 | Adams et al. | 524/66 |
| 5,041,183 | 8/1991 | Nakamura et al. | 156/264 |
| 5,077,637 | 12/1991 | Martorana et al. | 361/386 |
| 5,111,359 | 5/1992 | Montesano | 361/388 |
| 5,187,225 | 2/1993 | Kitagawa | 524/847 |
| 5,218,977 | 6/1993 | Takahashi | 132/54 |
| 5,224,030 | 6/1993 | Banks et al. | 361/386 |
| 5,255,738 | 10/1993 | Przilas | 165/185 |
| 5,262,229 | 11/1993 | Lampert et al. | 428/220 |
| 5,316,080 | 5/1994 | Banks et al. | 165/185 |
| 5,336,443 | 8/1994 | Odashima | 252/511 |
| 5,390,217 | 2/1995 | Ioki et al. | 376/150 |
| 5,390,734 | 2/1995 | Voorhes et al. | 165/185 |
| 5,510,748 | 4/1996 | Blackmon et al. | 165/41 |

*Primary Examiner*—Christopher Raimund
*Attorney, Agent, or Firm*—Limbach & Limbach L.L.P.

[57] ABSTRACT

A thermally conductive film that includes a film of polymeric matrix material having a thickness t defined between a top surface and a bottom surface. A plurality of fibers, having a greater thermal conductivity than the polymeric matrix material, is disposed in the film and extends between the top surface and the bottom surface. Each of the fibers are oriented in the film to form a fiber-to-film surface angle θ relative to the top and bottom surfaces that is greater than about 45° but is less than arctan t/d, where t is the thickness of the film and d is the diameter of the fibers in the direction of the angle θ. A shear/extruder apparatus is used to form the thermally conductive film from a sheet of composite prepreg material. An upper die block and a lower die block separated by a predetermined distance form an extrusion slot therebetween. A ram blade is dimensioned to intermittently insert into the input opening of the extrusion slot so that when the prepreg is positioned in front of the input opening, the prepreg is repetitively sheared by the ram blade to form sheared pieces that are forced into the extrusion slot and merged together to form the thermally conductive film with the fibers disposed therein extending substantially between the top surface and the bottom surface of the film and oriented to have the fiber-to-film surface angle θ.

8 Claims, 12 Drawing Sheets

THERMALLY CONDUCTIVE JOINING FILM

FIELD OF INVENTION

This invention relates to thermally conductive materials used in heat transfer joints. More particularly it relates to a joining film composed of a thin polymeric composite sheet material containing orientated thermally conductive fibers, processes for manufacturing this film and use of this film in heat transfer joints.

BACKGROUND OF THE INVENTION

Thermal management is a major concern in the design of electronic components. All aspects of electronic system thermal management and the role of thermally conductive joining materials are discussed in ASM International's Electronic Materials Handbook, Volume 1, Packaging, 1989. Heat generated during equipment operation must be removed in order to avoid circuit damaging temperature buildups. The failure rate of semiconductor devices (chips or dies) increases exponentially with increasing temperature due to irreversible degradation of the transistor junctions. A major pathway for heat removal in electronic assemblies is by conductive diffusion of the heat through thermally conductive materials.

On-going electronic design trends dictate the need for improved thermal management materials. Improved electronic performance is accomplished by circuit miniaturization, closer component spacing, and by increasing power levels to increase circuit speed. These changes result in a higher heat flux that must be removed. The present state of the art needs materials with improved thermal transfer properties to improve removal of heat from components thereby leading to increased electronic equipment reliability and service life.

Thermally conductive joints transfer heat in electronic assemblies between physically connected parts. They are an important part of most heat removal paths. The heat transfer efficiency of these joints is defined by the concept of thermal resistance:

$$R = t/kA, \qquad (1)$$

where R is thermal resistance (°K/watt), t is the thickness of the joint (m), k is thermal conductivity (W/m·°K), and A is the area of the joint (m$^2$).

The lower a joint's thermal resistance (R) is, the greater is its heat transfer efficiency. This results in a lower temperature rise for a device at a given power level. As illustrated by equation (1), decreasing the thickness (t) of a joint decreases its thermal resistance (R). For materials that have the same thermal conductivity in all directions (thermally isotropic), this also makes thickness uniformity desirable. Otherwise, non-uniform heat flow rates will occur between the thick and thin portions. Increasing the thermal conductivity of the joint material and/or the area A decreases the thermal resistance (R). This makes it a requirement that any joint material conform to all the available surface area and not leave gaps or voids.

There are three types of thermally conductive joints important to electronic equipment:

(1) A bare contact between two rigid materials is the simplest joint. This joint cannot hold the materials together on its own and must have support provided from some other source. The thermal efficiency of this joint is related to how close the joint surfaces fit together. On a microscopic scale, the materials will only make point contacts leaving air gaps covering most of the contact area. Due to the extremely poor thermal conductivity of air (0.035 W/m·°K), the thickness of this gap must be reduced as much as possible. This thickness is determined by the smoothness and precision of the fit between the contact surfaces. Costly machining operations are typically required to allow these joints to transfer heat efficiently. Bare contact joints are also subject to corrosion and contamination problems.

(2) The bonded joint is the most common type used in electronic assemblies. A thermally conductive adhesive joining material adheres to the joint surfaces to hold the surfaces together and conducts thermal energy between the joint surfaces. Usually a thermally conductive adhesive flows over a joint surfaces when the joint is formed. The thermal efficiency of this joint is determined by how completely the adhesive covers the joint surface, the thermal conductivity of the adhesive layer and the thickness of this layer.

(3) The gasketed joint is increasingly being used in electronic assemblies. The gasket is a thermally conductive solid sheet of joining material that does not flow when the joint is formed. The gasket joint's thermal efficiency is determined by how closely the gasket joining material conforms to the joint surface, the thermal conductivity of the gasket joining material and its compressed thickness. The gasket joining material is typically a rubber (elastomeric) sheet. A joint with this material in it is typically held together with clamps or by pressure sensitive adhesive on the surface of the rubber. In some cases the rubber may have pressure sensitive adhesive properties of its own.

A desired characteristic of all thermally conductive joining materials is that they be able to intimately contact the joint surface by conforming to its shape. The joining material does this during the fabrication process by flowing as a liquid or by compressing as a solid. This allows surfaces that are not perfectly matched to be efficiently, thermally joined. This typically eliminates the surface machining required for bare contact joints and leads to lower manufacturing costs.

Another desired characteristic of thermally conductive joining materials is a low thermal joint processing temperature, which minimizes problems caused by coefficient of thermal expansion (CTE) stress. Die bonding usually entails heating the joining material for bonding with the surface to be joined. Normally the semiconductor has a CTE that is different from the substrate it is being bonded to. Therefore, the greater the temperature excursion during the processing of the die bond, the greater the CTE stress on the semiconductor chip when it cools down. This can lead to damage or lower reliability for the device. Therefore a lower processing temperature is desirable for the die bonding material.

CTE stresses can also be decreased by lowering the in-plane stiffness of the die bond itself. Therefore a die bond material with a lower in-plane rigidity (modulus) is desirable. Higher bond material thickness lowers the CTE stresses but this normally increases thermal resistance. In order to minimize CTE stress, a particularly desirable combination of attributes for a die bonding material would be a low processing temperature, a low in-plane modulus, and higher thermal conductivity to allow increased bond material thickness with the same or lower thermal resistance.

Often the electrical properties of a thermal joining material are important. The thermal joint for some electrical designs is either electrically conductive or insulating. It is desirable therefore that an improved thermal joint be capable of being either electrically conductive or non-conductive.

The most common forms of materials used for electronic joints are pastes and films. Pastes are liquid materials that are typically applied by hand application or by a machine controlled syringe. Films are thin, controlled thickness sheets of the joining material. Films can be either semi-liquid or solid materials that become liquid during processing or rubber materials that will conform under compression. Films offer advantages in uniform thickness control, reduced voids and less material waste.

The most commonly used materials for thermally conductive joints are solders, silver-glass eutectic alloys, and organic polymers. All of these materials when used in joints have serious deficiencies. For example, a major problem with thermally conducting solder joining materials is that higher thermal conductivity is attainable only by using undesirable high processing temperatures. The thermal conductivity of solders range from 35 to 73 W/m·° K. Solder thermal joints must also have a melting point that significantly exceeds subsequent processing temperatures. This limits processing temperatures with solder to a relatively high range, which leads to CTE stress problems. Solder is also subject to fatigue cracking caused by CTE stresses generated by temperature cycling during normal equipment operation.

Silver-glass bonds are normally achieved by applying a mixture of silver flake loaded glass that is dispersed in an organic matrix and firing it at 320° to 460° C. The organic matrix is burned out and an eutectic alloy bond material is formed. The high temperature firing leads to CTE stress problems, requires extra coating steps, and can have oxide formation problems. Silver-glass has a thermal conductivity of 40 to 75 W/m·° K.

Organic polymers typically have a low processing temperature, low manufacturing costs, and low in-plane modulus. Organic polymers also exhibit excellent compressibility, thus intimately contacting the joint surfaces being mated even though these surface do not exactly match in shape. However, organic polymers also have very low thermal conductivity (0.1 to 0.3 W/m·° K).

Thermally conductive fillers have been added to organic polymers to increase the thermal conductivity. While the fillers increase the thermal conductivity of organic polymers significantly, the thermal conductivity achieved is still only a tiny fraction of the conductivity of the fillers themselves. Silver has a thermal conductivity of 420 W/m·° K, but silver filled polymers achieve only 2 to 6 W/m·° K. Diamond filler has a thermal conductivity of over 1500 W/m·° K, but diamond filled polymers achieve only 8 to 11.5 W/m·° K.

Thermally conductive fibers have also been used to fill polymers to improve thermal conductivity. For example, Eddy et al., in U.S. Pat. No. 4,321,033 (1982) describes carbon or metal fibers in a brush configuration that is impregnated with an elastomer material. An improvement in thermal conductivity over silicon rubber of about 3 times is described. However, the Eddy et al composite material is not useful or adaptable as a thermally conductive joining film, because it is too thick. It is stated that the brush fabric can not be conveniently made below 30–50 mils (0.76–1.27 mm) in thickness. Yet, it is desirous that a thin film of joining material be less than 30 mils.

Lee et al., in U.S. Pat. No. 4,729,166 (1988), describe a means for fabricating an anisotropic electrical conductor having conductive fibers that run through the thickness so that they extend from surface to surface. These fibers are also oriented to extend in a direction that is substantially perpendicular to the surfaces of the conductor. The composite material in Lee et al., however, lacks the proper compressibility required to be an effective thermally conductive joining film. While polymer based matrix materials may exhibit sufficient local compressibility, the fibers extending between the matrix surfaces act as small rigid columns that resist compressive loads and therefore are incapable of compressing locally to accommodate a variable gap between substrates. Without the ability to compress, these composite materials can efficiently thermally join only two perfectly matched surfaces. Even with two matched surfaces, the fibers would have to be exactly the same length and would have to exactly match each top and bottom surface.

In order to locally compress the prior art films, the fibers therein must start to buckle under the compressive load before the elastomer around them can start to compress. A simple column buckling analysis using Euler's formula is described in Standard Handbook of Machine Design, chapter 15, 1986, McGraw-Hill, Inc. The unrestrained load ($P_{CR}$) on the ends of a fiber required to start it to buckle is given by:

$$P_{CR} = \pi^2 EI/L^2, \qquad (2)$$

For a round fiber the moment of inertia, $I=0.049d^4$, therefore:

$$P_{CR} = 0.049\pi^2 Ed^4/L^2 \qquad (3)$$

In this case a conversion to the force ($F_{cr}$) applied is more useful:

$$F_{cr} = P_{cr}/A \qquad (4)$$

For a round fiber, the area A equals $\pi(0.5\ d)^2$, therefore:

$$F_{cr} = 0.19\pi Ed^2/L^2 \qquad (5)$$

where $F_{cr}$ is the applied critical compressive force (MPa), E is elastic modulus (MPa), d is fiber diameter (cm), and L is the length of the fiber (cm). The load required to start compressive deflection of the overall sheet is given by:

$$F = F_{cr} V_f \qquad (6)$$

where F is the compressive force (MPa) and $V_f$ is the fiber volume fraction.

According to equation 5, a copper fiber of 0.01 cm (0.004 in) diameter (d), a length (L) of 0.1 cm (0.039 in) and an elastic modulus (E) of 131,000 MPa (19 psi) would require a force ($F_{cr}$) of over 807 MPa (116,993 psi) to start the fiber elastically buckling, thus allowing the sheet to compress. Even assuming a low fiber volume ($V_f$) of 0.10, a force (F) of 80.7 MPa (11,699 psi) would be required to compress this material. This is beyond anything reasonable for an elastic sheet.

For a mesophase pitch based carbon fiber with a diameter (d) of 0.001 cm (0.0004 in) and a modulus (E) of 837,000 MPa (120 psi), a force ($F_{cr}$) of 50.9 MPa (7,389 psi) would be required to start to buckle a fiber length of 0.1 cm (0.039 in). Being a very brittle fiber, it would break after a small buckling deformation, permanently disrupting the heat flow path. A fiber volume ($V_f$) of only 0.10 would require 5.1 MPa (739 psi) to start deforming the sheet.

An elastic material proper for thermal joining should yield easily to finger tip pressure. Therefore, it is clear that fibers extending directly between the film surfaces where they are substantially perpendicular to the film surfaces, as shown in the prior art, are not easily compressible and thus unacceptable for an effective thermal joining film. This compressibility problem is independent of the properties of the surrounding matrix and holds true even if a liquid state could somehow be embodied for the elastomer.

In summary, there is a need for a thermally conductive joining film that has the high thermal conductivity evidenced by extending thermally conductive fibers completely through its thickness, but which is capable of local compression with minimal force in order to form an effective thermally conductive joint. There is also a need for this film to have a uniform thermal conductivity even in areas that are locally compressed to a smaller film thickness. Lastly, there is a need for an efficient, low cost process to make large quantities of high quality thermally conductive thin joining films that have superior local compression characteristics. Such a process should make the film in long roll lengths with a tightly controlled thickness.

SUMMARY OF THE INVENTION

The present invention provides a novel thermally conductive joining film that exhibits high thermal conductivity as well as high local compressibility. This film also exhibits uniform conductivity even in area that are locally compressed to a smaller film thickness. The film of the present invention is compatible with most polymeric matrix materials so that low processing temperatures can be utilized with a matrix having a low in plane modulus.

The problem of compressive conformability is solved by the invention by a novel orientation of the fibers within the film. The film properly compresses during the fabrication of a bonded joint or an elastomeric gasket resulting in efficient heat transfer through the joint while sealing out moisture or other contaminates.

The thermally conductive film of the present invention includes a film of polymeric matrix material having a thickness t defined between a top surface and a bottom surface. A plurality of fibers, having a greater thermal conductivity than the polymeric matrix material, is disposed in the film and extend between the top surface and the bottom surface. Each of the fibers are oriented in the film to form a fiber-to-film surface angle $\theta$ relative to the top and bottom surfaces that is greater than about 45° but is less than arctan t/d, where t is the thickness of the film and d is the diameter of the fibers in the direction of the angle $\theta$.

The thermally conductive film is formed using a shear/extruder apparatus from a sheet of composite prepreg material formed of a polymeric matrix material with thermally conductive fibers disposed therein extending lengthwise in the plane of the sheet. The fibers have a greater thermal conductivity than the polymeric matrix material. The apparatus includes an upper die block and a lower die block separated by a predetermined distance to form an extrusion slot therebetween. The slot has an input opening at one end and an output opening at an opposite end. A ram blade is dimensioned to intermittently insert into the input opening. When the prepreg is positioned in front of the input opening, the prepreg is sheared to form sheared pieces that are forced into the extrusion slot and merged together to form a film when the ram blade repetitively enters the input opening. The thermally conductive film is formed by shearing pieces of the prepreg material while simultaneously pushing the sheared pieces down the extrusion slot. The sheared pieces are merged together to form a thermally conductive film with the fibers disposed in the film extending substantially between the top surface and the bottom surface of the film.

A thermal bond is formed by first forming the film of polymeric matrix material having thickness t defined between top and bottom surfaces. The film has a plurality of fibers that have a greater thermal conductivity than the polymeric matrix material and which are disposed in the film and are capable of extending between the top and bottom surfaces. Each of the fibers are oriented in the film to form a fiber-to-film surface angle $\theta$ relative to the top and bottom surfaces that is greater than about 45° but is less than arctan t/d, where t is said thickness of the film and d is the diameter of the fibers in the direction of the angle $\theta$. The film is then inserted between first and second bonding surfaces. A bonding pressure F is applied between said first and second bonding surfaces to form the thermal joint.

Other objects and features will become apparent by a review of the specification, claims and appended figures.

BRIEF DESCRIPTION OF THE DRAWINGS

FIGS. 13A to 13E are side views of various applications of the thermally conductive fiber of the present invention.

DETAILED DESCRIPTION OF THE PREFERRED EMBODIMENTS

Figure 1:
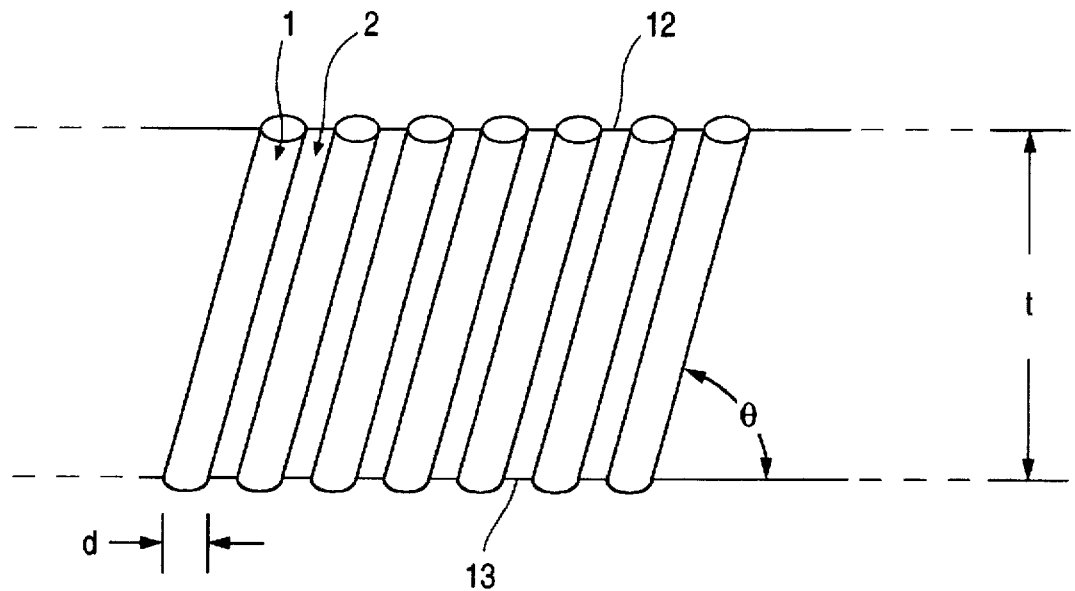
FIG. 1 is a cross-sectional side view of the thermally conductive film of the present invention.

The thermally conductive joining film 100 of the present invention is illustrated in FIG. 1, and comprises a thin sheet of composite material composed of fibers 1 contained in a polymeric matrix material 2 that has a lower thermal conductivity than the fibers 1. The fibers 1 are capable of extending through the thickness t of the joining film 100 from the top surface 12 to the bottom surface 13. The fibers 1 are orientated with a fiber-to-film surface angle Θ that is below 90° so that a compressive force applied to the plane of the film causes the fibers to tilt over rather than act as stable columns (tilt mechanism). The fiber-to-film surface angle Θ is sufficiently high enough, however, and the fibers are stiff enough, such that the fibers will spear through the matrix to surfaces 12/13 as it is compressed usually in a softened state (the spearing mechanism) so the fibers make contact with the surfaces being joined (the joint surfaces). Therefore, the joining film 100 exhibits excellent local compressibility while ensuring the fibers 1 make contact with the joint surfaces.

The fiber tilting mechanism of the present invention dictates a maximum fiber-to-film surface angle to ensure proper compressibility:

$$\theta_f = \arctan t/d \quad (7)$$

where $\theta_f$ is the maximum angle between fiber and film surface plane, t is the fully compacted film thickness, and d is the fiber diameter in the same plane as $\theta_f$.

The maximum angle $\theta_f$ is the point at which all of the top of the fiber tilts past all of the bottom of the fiber. If the fiber were standing on end by itself, $\theta_f$ is the angle at which gravity would tip it over. Determining the fiber diameter in the same plane as the fiber angle ($\theta_f$) accounts for non-round fibers. In practice this is nearly always the minimum diameter of the fiber. As an example of this minimum fiber angle requirement, a film with a thickness (t) of 0.25 mm (0.01 in) and a fiber diameter (d) of 0.025 mm (0.001 in), would require the maximum fiber angle ($\theta_f$) to be 84°.

The fiber spearing mechanism of the present invention requires that the fibers 1 be stiff enough (rod-like) to push their way through the (softened) matrix 2 without buckling under the load of the matrix pushing on their ends to make contact with the joint surfaces. This load is given by:

$$P = \sin\theta_f F_j A_f \quad (8)$$

where P is the effective load on the fiber end along the fiber axis, $F_j$ is the joint fabrication pressure (MPa), sin $\theta_f$ is the load vectoring factor, and $A_f$ is the fiber area. Equation (8) can be substituted back into the Euler equation described earlier and rearranged to give a required minimum fiber column stiffness ($E_f$):

$$E_f = EI/L^2 A_f = \sin\theta_f F_j \pi^2, \quad (9)$$

where $E_f$ is the minimum fiber column stiffness, E is the elastic modulus (MPa), I is the moment of inertia (cm$^4$), and L is the fiber length (cm).

For a circular fiber cross section I=0.049d$^4$ and $A_f$=(0.5d)$^2$, therefore:

$$E_f = 0.196 E d^2/L^2 = \sin\theta_f F_j/\pi^2 \quad (10)$$

Moments of inertia for other cross section shapes are obtainable from Machinery's Handbook 24th edition, page 189 to 198. The minimum fiber column stiffness ($E_f$) can be used to judge the suitability of a fiber for use in the joining film of the present invention. An example of this procedure is provided below for a joint being made with a required 0.69 MPa (100 psi) bonding pressure ($F_j$) with a joining film of 0.1 cm (0.039 in) thickness and a fiber angle of 84°. In this case the minimum column stiffness ($E_f$) required is:

$$E_f = \sin\theta_f F_j/\pi^2 = (0.994)(0.69)/(9.87) = 0.069 \text{ MPa}$$

Two fibers can be compared against this value:

| nylon | copper |
|---|---|
| E = 3,300 MPa | E = 131,000 MPa |
| d = 0.001 cm | d = 0.001 cm |
| L = 0.1 cm | L = 0.1 cm |
| $E_f$ = 0.065 MPa | $E_f$ = 2.57 MPa |

Comparing these values with the calculated minimum column stiffness, the nylon fiber is not suitable for the invention, but the copper fiber is.

The fiber spearing mechanism also dictates that the fiber-to-film surface angle Θ be no less than about 45°. Below this minimum angle value, the fiber ends will drop below the surfaces 12/13 due to fiber tilting more than it will spear toward the surface due to compression of the matrix around it. Further, the thermally conductive fibers must also be in long enough lengths that nearly all the fibers will be able to span the final joint thickness given their fiber angle Θ.

Figure 2A:
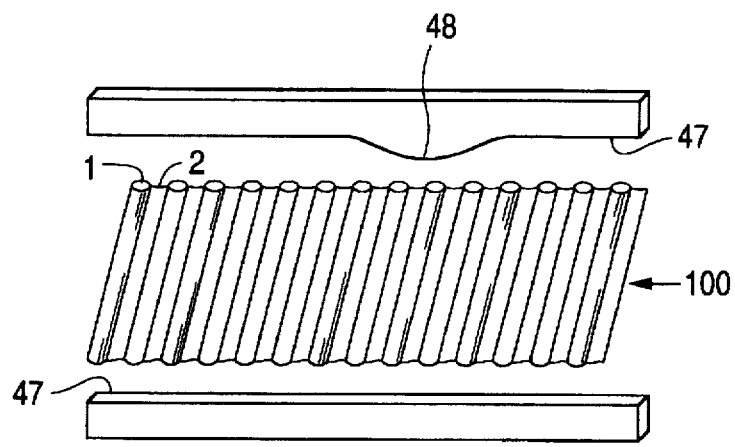
FIGS. 2A and 2B are side cross-section views of the film that illustrate the formation of a thermal joint having a surface irregularity.
Figure 2B:
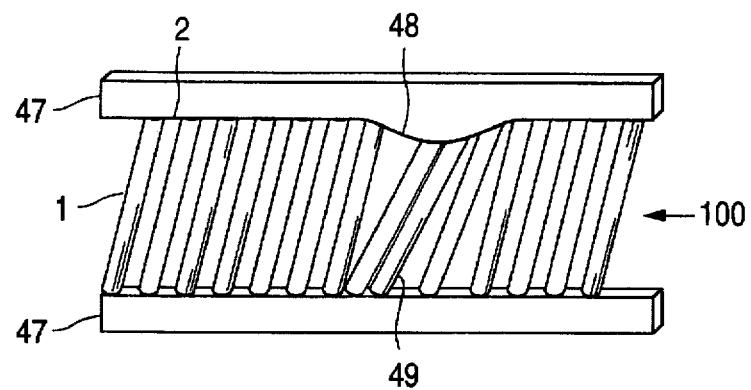

FIGS. 2A and 2B illustrate the film's fiber tilt mechanism and how the film can compressively contour to an irregular joint surface. In FIG. 2A, two joint surfaces 47 are shown ready to be joined by the thermally conductive film 100. A surface irregularity 48 is shown on the upper joint surface 47. In FIG. 2B the completed joint is shown. Fibers 49 in the area of the surface irregularity have tilted and slid slightly along the surface in order to make room for the thinner area of the joint. Because the length of the fiber determines the thermal resistance across the joint, the heat flux in the thinner area is the same as the thicker portions. Therefore, thin and thick areas of the joint have a uniform thermal resistance. Further, as the fiber tilt increases, the force required for further compression decreases. This makes the material particularly adept at yielding to high points on a joint surface.

Most fibers made from ceramics, glasses or metals are suitable for use in the present invention. Fibers can also be made by cutting strips from materials available in foil or deposited film form by laser machining or other methods. The fibers must have a thermal conductivity that is higher than the matrix they will be combined with. Low thermal conductivity fibers can be coated with higher thermal conductivity materials such as diamond, graphite, nickel, copper or aluminum. The fibers must also be capable of being precisely sheared in combination with the matrix (as described below). The thinnest available diameter fibers are preferred so long as they are stiff enough to allow the spearing mechanism to work.

The electrical conductivity properties of the film 100 can be determined by proper selection of the fiber. For example, copper or copper/metal plated fibers can be chosen for high electrical conductivity through the film 100. Alternately, diamond or silicon carbon can be selected for low electrical conductivity through the film 100.

While most ceramic or glass fibers are suitable, the higher thermal conductive ceramic or glass fibers are preferred in forming thermally conductive film 100. Examples of possible fiber materials include:

(e=electrically conductive, n=non-electrically conductive)

aluminum coated glass: Tracor chaff fiber (e)
aluminum nitride coated fibers (e or n)
aluminum nitride coated films, laser cut strips (e or n)
aluminum nitride fibers (n)
alumina fibers: 3M's Nextel™ 610 (n)
boron nitride coated ceramic fibers: Advanced Ceramic Corp.'s Boralloy® PBN (n)
carbon fibers: Mitsubishi Rayon's Grafil® HM (e)
diamond film, laser cut strips (n)
diamond fibers (n)
diamond coated fibers (e or n)
diamond coated films, laser cut strips (e or n)
mesophase pitch based carbon fiber (e):
Amoco's P120, P100, EWC-300x and K1100
Mitsubishi Chemical's Dialead® K13C2U
Nippon Graphite Corp.'s Granoc
pyrolytic graphite coated fibers (e)
metal plated carbon fibers (e)
metal coated ceramic or glass fibers (e)
silicon carbide fibers: Dow Corning's Sylramic™ (n)
Examples of metal fibers include:
aluminum wire, (e)
beryllium wire, (e)
bronze wire, (e)
copper wire, (e)
copper foil, layer cut strips (e)
silver foil, layer cut strips (e)
copper/silver wire, (e)
silver wire, (e)
tungsten wire, (e)
zirconium copper wire, (e)

Figure 3:
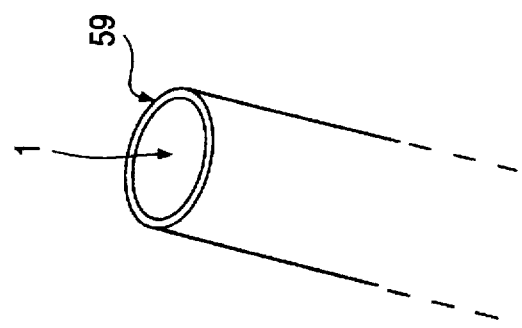
FIG. 3 is a perspective view of the fiber having a coating thereon.

FIG. 3 illustrates a coating 59 formed on the fiber 1 using standard techniques to give the fibers desirable properties. For example, coating 59 can be added to produce the desired thermal and electrical conductivity or magnetic properties. Coating 59 could also be added to aid curing of the matrix material 2. The orientation of the fiber in the matrix allows light to go all the way through the film's thickness provided the matrix is sufficiently transparent. In most conventional composites the fibers are plane orientated and the first layer of fibers absorbs the light. A reflective coating on the fiber will make them act as parallel mirrors and will enhance the transmission of light down into the film. Preferred examples would be aluminum, silver or gold coatings. Light transmission can also be enhanced by the addition of transparent fibers parallel to the thermally conductive fibers. A preferred example would be quartz fibers. Fiber coatings could aid other electromagnetic energy assisted cures. An absorptive coating would absorb the curing energy, converting it into heat, and the thermal conductivity of the fibers would efficiently transmit it throughout the entire film layer. A carbon and/or metal coating would be a preferred example for microwave, induction, or electron beam curing techniques.

It is well known in the art how to impregnate relatively long fibers with a lower thermal conductivity matrix to form parallel fibers within a sheet of matrix material (commonly called "prepreg"). Prepreg can be made in very thin sheets with the fibers running through the length of the sheets. Therefore, it is preferable that the joining film of the present invention be formed by cutting or shearing prepreg to form a thin film with fibers extending through the film's thickness at the predetermined fiber-to-film surface angle θ.

Most of the polymeric materials used as composite material matrixes or as joining materials are suitable for this invention. The matrix should have a brittleness sufficient to allow a clean shear fracture of the composite prepreg. The matrix should also be capable of allowing merging of sheared pieces into a film and the subsequent processing of the film that results in a completed joint material having the desired thickness.

Many suitable matrix materials are brittle enough at room temperature to be properly sheared. If not, the matrix can achieve its brittleness by cooling, if necessary. This may involve simple refrigeration for modest reductions in temperature. Liquid nitrogen can be sprayed on the prepreg to achieve temperatures down to −195° C. In extreme cases liquid helium could be used to lower the temperature to −268° C. It is preferred that the matrix not require cooling below liquid nitrogen temperatures. Brittleness can be also be increased by increasing the shearing rate due to viscoelasticity properties of the prepreg.

The finished film should also be capable of consolidation, where the film is permanently compressed in its thickness direction to form a finished film product with properly aligned fibers extending through the film's thickness. Matrix materials are suitable for consolidation if they can be permanently deformed under pressure. In addition, matrix materials used to form a joining film from prepreg need to exhibit the ability to merge or weld pieces of sheared prepreg together either by temperature and/or applied pressure processing. It is preferred that the pieces of prepreg be capable of being welding together at between 6.9 to 345 MPa (1000 to 50,000 psi). The temperature required for consolidation varies greatly depending on the matrix polymer. Some, such as many thermoset polymers, exhibit the ability for the sheared pieces to be compressively welded together at the same temperature required for shearing. Others may require only a slight warming to temperatures still well below room temperature. Other matrix materials, such as high temperature thermoplastics, may require warming to high temperatures to start to achieve softening.

It is preferred that the matrix material exhibit a broad temperature range of softening rather than a narrow temperature range melting point. This makes the material more controllable during processing. Polymeric materials that exhibit a sharp melting point can be typically compounded or alloyed with other materials to give them a much broader melting temperature range and therefore exhibit softening at the bottom end of this range. The matrix material must typically turn to a full liquid state to be processed into a bonded joint or a gasket material. Depending on the material type, the matrix may turn liquid and reactivity convert into a solid or it may melt and turn back into a solid after cooling.

Using the same techniques used for polymeric composite matrixes or joining materials, the matrix materials suitable for the invention can be modified to desirably change their properties. Low or negative thermal expansion materials, such as carbon fibrils or zirconium tungstate particles, can be added to lower the thermal expansion coefficient. Microspheres can be added to lower the density and lower the modulus. Thermally conductive fillers can be added to improve thermal transfer from the fibers to the joint surfaces. Reaction initiators can be added to aid polymer cure by light or other initiated means.

Processing during the joint fabrication process can change the matrix into a non-polymeric material. A polymeric matrix could be converted to carbon. A polymer matrix loaded with silver filled glass particles could be converted into a silver-glass joint. A polymer matrix loaded with the starting ingredients for ceramic materials could be converted into a ceramic joint.

The preferred matrixes are those polymeric materials commonly used for composites or joints. Examples include:
acrylates
bismaleimides
bismaleimide triazines
cyanate esters
cyanate resins
cycloaliphatics
epoxies
fluoropolymers
polyacrylonitriles
polyamides
polycarbonate
polyetheretherketone
polyesters
polyether-imides
polyether sulfone
polyethylenes
polyimides
polystyrenes
urethanes
silicones
siloxane-polyimide copolymers A method and shear/extruder apparatus 101 for making the above described thermally conductive joining film 100 from a sheet of prepreg composite material is described below and illustrated in FIGS. 4A and 4B. The shear/extruder apparatus includes a ram assembly 29, and an extrusion slot 66. The extrusion slot is formed by a top die block 5, a bottom die block 4 and walls 65. The top die block 5 has a sharpened shearing edge 6 on it to aid the shearing operation. The top and bottom die blocks are clamped or bolted together with walls 65 therebetween. The ram assembly 29 has a ram blade 28 that provides the shearing action and rams the cut material into the slot 66. The ram blade has a face 8 with a sharpened shearing edge 7. The face 8 is oriented at an angle φ relative to the extrusion slot opening that allows the ram blade 28 to optimally shear the prepreg 3. A clamp bar 9 holds the prepreg 3 in place with a defined force determined by a spring 10 or other controlled compression force device. Anti-friction surfaces 11 allow the ram blade 28 to freely move and to be held in place by the clamp bar 9. Alignment rails 61 guide the ram assembly 29 during operation. Side guides 60 keep the width of the prepreg 3 aligned with the slot 66.

The composite prepreg 3 used to form film 100 is made from fibers impregnated with a matrix material using any of the well known methods in the art. The preferred range of fiber volume percentages is from 0.5 to 75%, depending upon the desired thermal resistance for the joint to be formed. The fibers should be well dispersed in the matrix. The thickness range of the prepreg is preferred to be between the thickness of the fiber and 1 mm (0.039 in). The prepreg must be capable of being precisely sheared by the shear/extrusion apparatus 101. This means that sheared pieces of prepreg have a separation between the fracture planes with a preferred standard deviation of no more than 0.025 mm (0.001 in), which is dictated by the matrix's brittleness range, the fiber's strength range, the ram blade angle and the ram cutting temperature. It is important to keep the prepreg free from condensed moisture contamination if it is cooled. This can be accomplished by the use of a dry air enclosure around where the prepreg is cooled and fed into the shear/extruder 101.

Figure 5A:
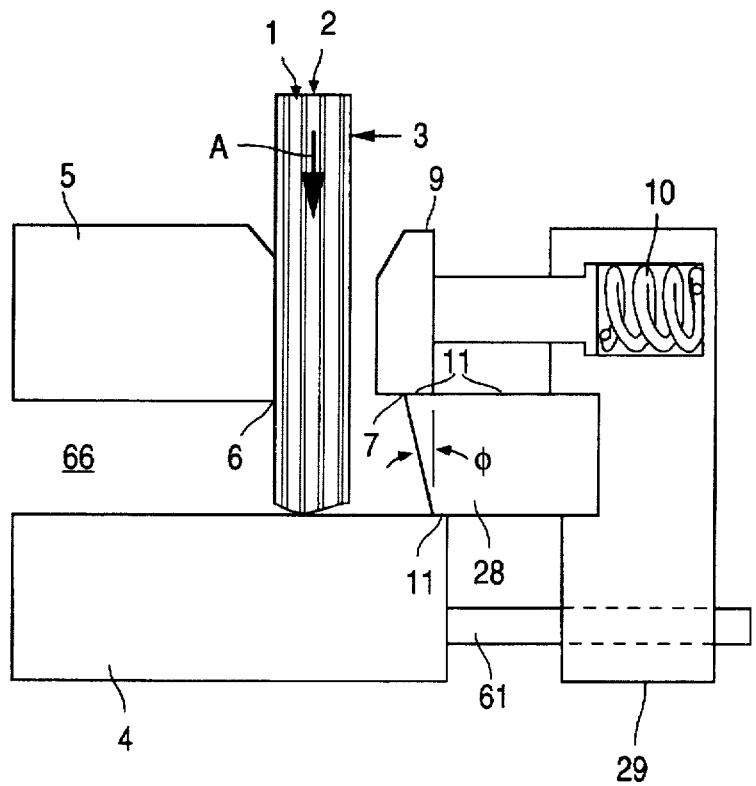
FIGS. 5A to 5D are side cross-sectional views of the shear/extrusion apparatus that illustrate its operation in forming the thermally conductive film.
Figure 5B:
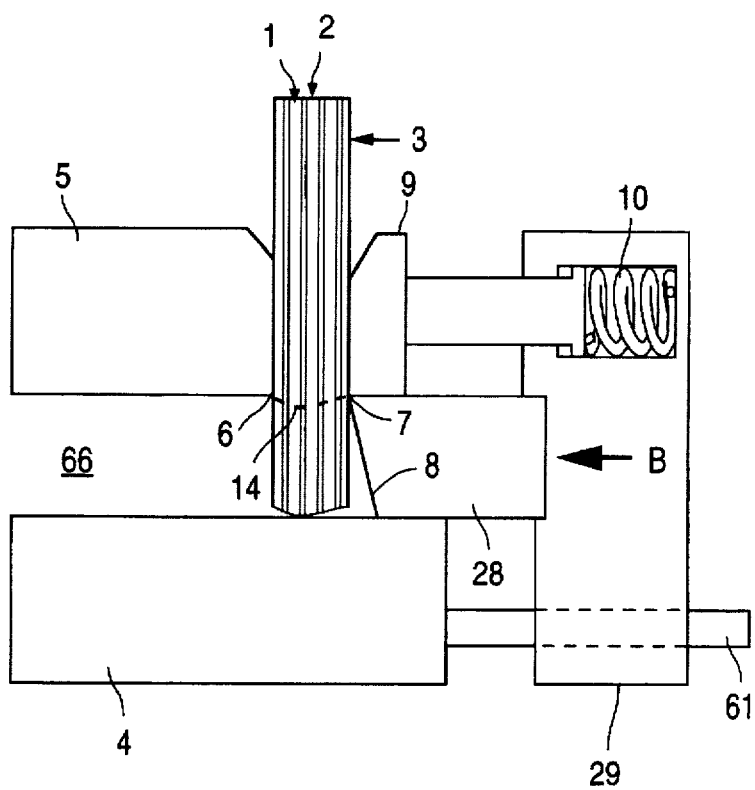

FIGS. 5A to 5D illustrate the process of making the thermally conductive joining film 100 of the present invention using the shear/extruder apparatus 101. After the prepreg 3 is formed, the prepreg material is cooled (if necessary) and fed in the direction of arrow A into the shear/extrusion apparatus 101 as shown in FIG. 5A. The ram assembly 29 is then moved forward in the direction of arrow B toward the prepreg 3 by a cam, crankshaft or other controlled motion mechanism, as illustrated in FIG. 5B. The clamp bar 9 makes initial contact with the prepreg 3 and holds it in place with a clamping force from the compressing spring 10. The ram assembly 29 continues to move forward until the ram blade 28 contacts the prepreg 3 and causes a shearing action between the ram blade shearing edge 7 and the top die block shearing edge 6. A clean shear fracture 14 forms in a characteristic shear fracture "V" shape, which is described in further detail below.

Figure 5C:
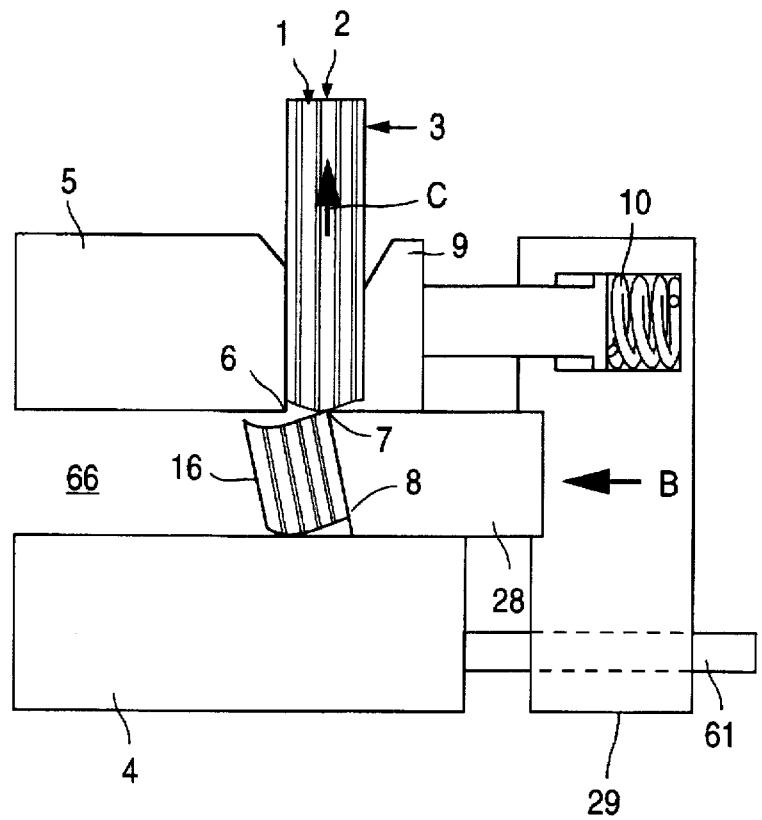

As illustrated in FIG. 5C, a sheared piece 16 shears off the end of the prepreg 3 and is pushed into the slot 66 by face 8 of the ram blade 28. The remaining prepreg 3 is simultaneously pushed up in the direction of arrow C by the shearing forces and by the forward motion of sheared piece 16, which raises the end of the prepreg 3 out of the way and avoids fiber damage as the ram blade 28 passes underneath it. The "V" shaped bottom edge of the sheared separated piece 16 caused piece 16 to tilt slightly as it is pushed into the extrusion slot 66. This avoids wedging the sheared piece 16 in the slot 66 and fracturing the ends of the fibers. To complete the process cycle, the ram assembly 28 moves back in the direction of arrow D (FIG. 5D), thus returning the shear/extruder apparatus to the cycle starting point illustrated in FIG. 5A.

Figure 5D:
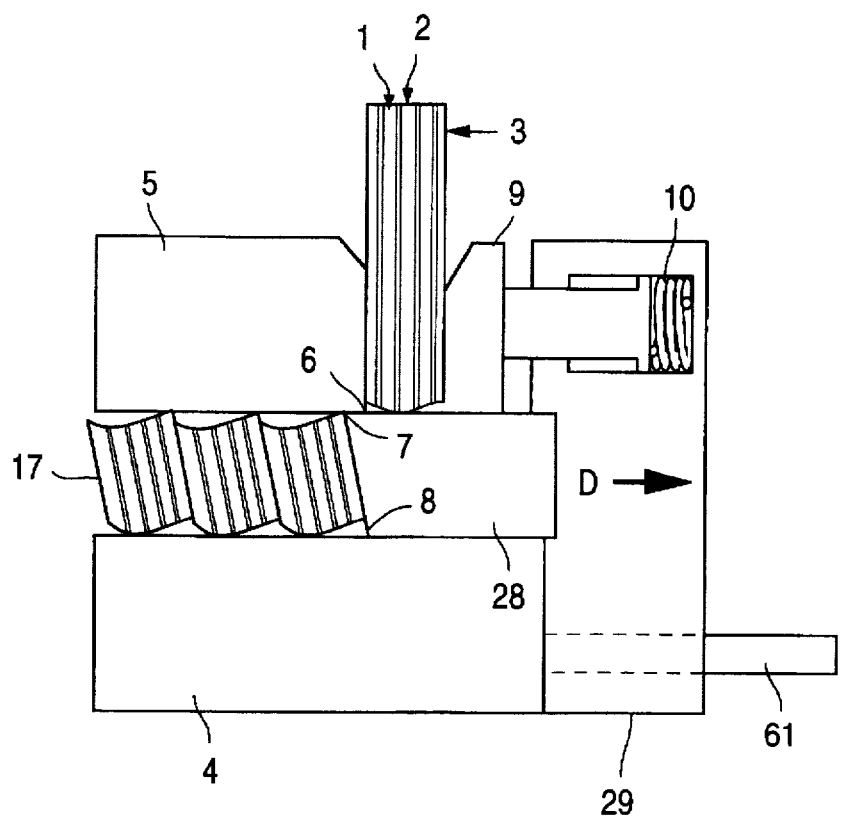

FIG. 5D illustrates the shear/extruder apparatus 101 after several cycles. The separate sheared pieces 16 are pushed up against each other with a high compressive force supplied by the ram blade 28. For many matrix materials, this compressive force is enough to weld the sheared pieces 16 into a continuous extruded film 17. Other matrix materials may require heating while in the extrusion slot to merge the sheared pieces 16 into a continuous film.

Figure 6A:
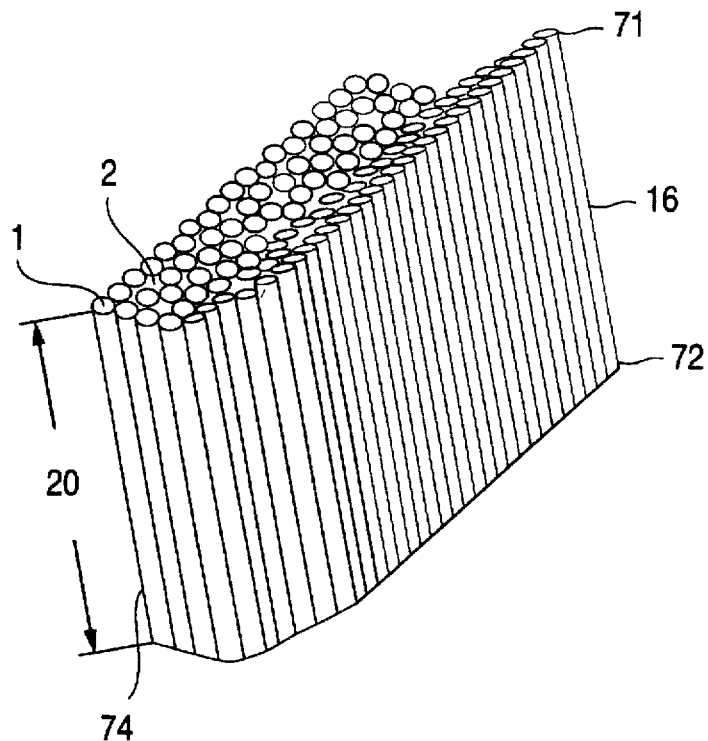
FIG. 6A is a perspective view of sheared piece of the prepreg.
Figure 6B:
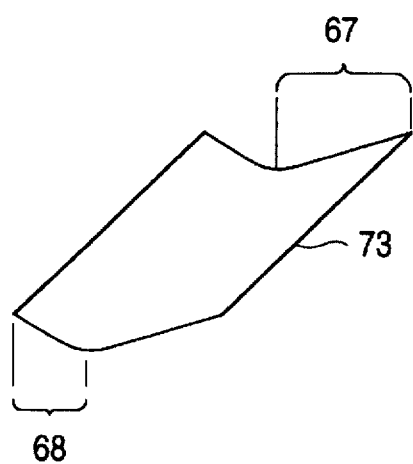
FIG. 6B is a perspective view of the top and bottom surface shape of the sheared piece.

FIGS. 6A and 6B illustrate the attributes of a correctly sheared piece 16. The shearing operation is controlled such that the same shape of sheared piece 16 is consistently produced. The shear fractures on the top surface 71 and bottom surface 72 have the same shape 73. This results in the fiber length 20 being consistent across the piece 16 and between the different pieces. The shape 73 is typically a blunted, slightly lopsided "V" shape. The shorter side of the "V" tends to be on the leading side 74 of the sheared piece 16.

The top trailing edge 67 of the piece has a ramp shape that aids in pushing the prepreg 3 above it out of the way after the fracture line 14 is formed. The bottom leading edge 68 has a shape that allows the slight tilting of the piece 16 as it is pushed into the extrusion slot 66. Piece 16 will rock onto the sloping trailing edge 68 as it is pushed by angled face 8 of the ram blade 28.

The shape and location of the "V" shaped shear fracture 14 is dictated by the prepreg composite material and by the angle φ of the ram blade 28. If the ram blade angle φ is too large, the "V" shaped shear fracture 14 will be too deep and will cause compressive compaction problems. If the ram blade angle φ is too small, then the shear fracture line 14 will be too high above the shearing edge 6 so that the sheared pieces 16 will not fit into the extrusion slot 66.

Figure 7A:
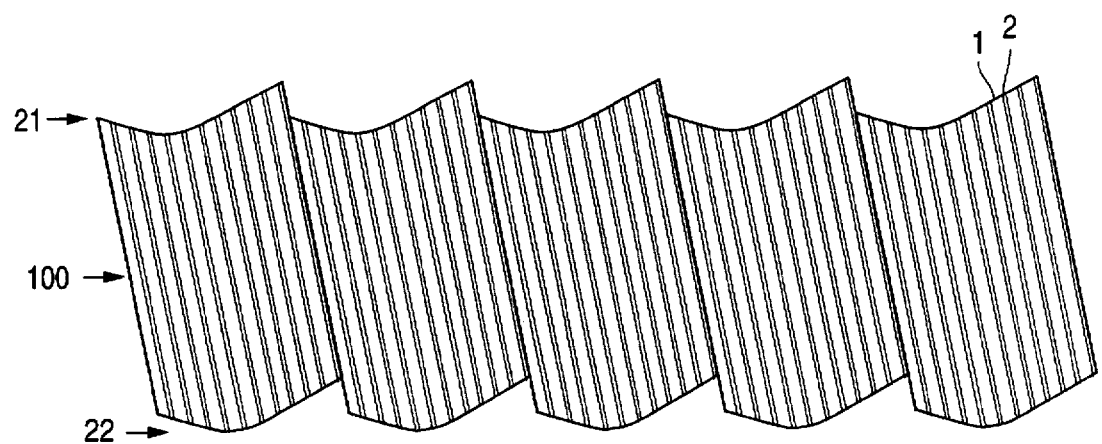
FIGS. 7A to 7C are side views of the film at different stages of vertical consolidation.
Figure 7B:
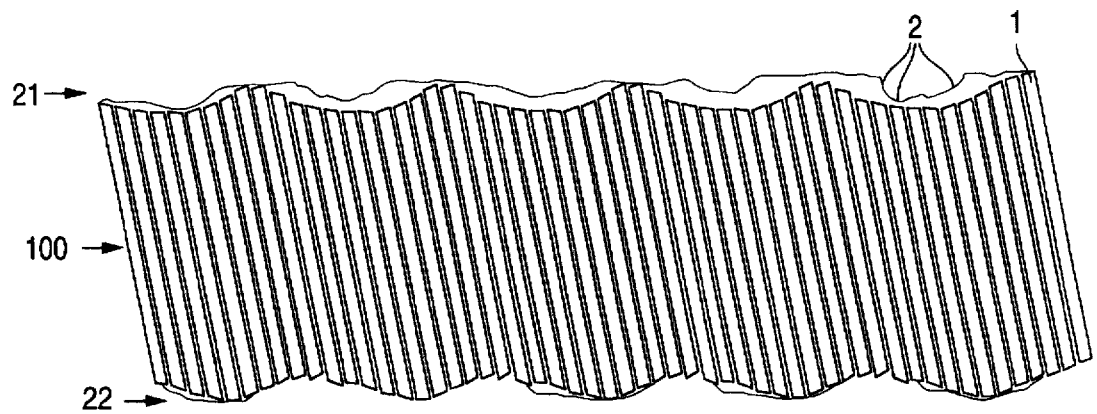
Figure 7C:
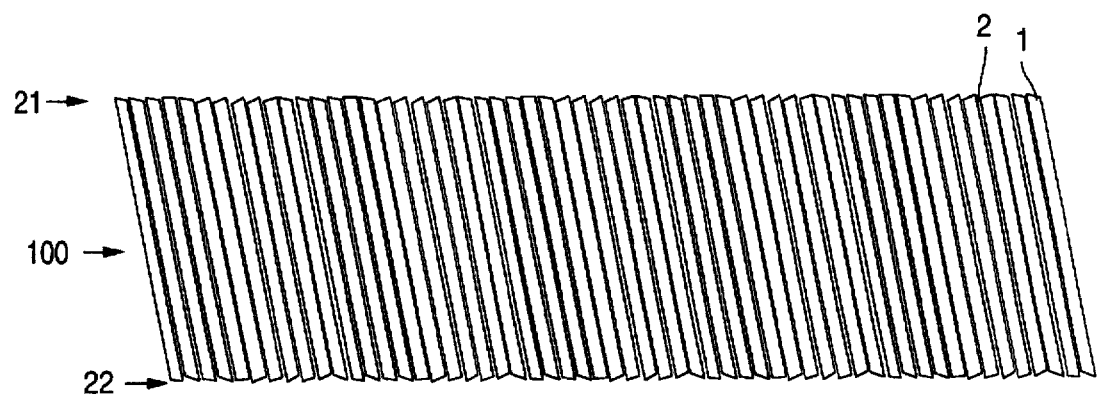

FIGS. 7A to 7C illustrate vertical consolidation of the film 100, which is the squeezing of the film that occurs either during processing after the film has left the extrusion slot or during fabrication of a joint. FIG. 7A illustrates the film 17 is as it typically leaves the extrusion slot 66. This film is not ideal as a bonding film at this point because it's top and bottom surfaces 21/22 are ridged resulting from the original "V" shaped shear fracture 14. Vertical consolidation is accomplished by compressing top and bottom surfaces 21/22 together to form smooth surfaces. FIG. 7B illustrates the state of the softened film 100 after the film compression process has started where the first contacts have been made by fiber ends to the surfaces 21/22. The surface ridges are starting to disappear. The stiffness of the fibers is enough that they will spear through the matrix when pushed by a surface contact on one end. If enough compressive compaction is applied, nearly all of the fibers will make contact with both surfaces 21/22. FIG. 7C shows the completely compressed film 100. The film surfaces 21/22 are smooth and the fibers are in contact with the film surfaces on both ends.

Figure 8A:
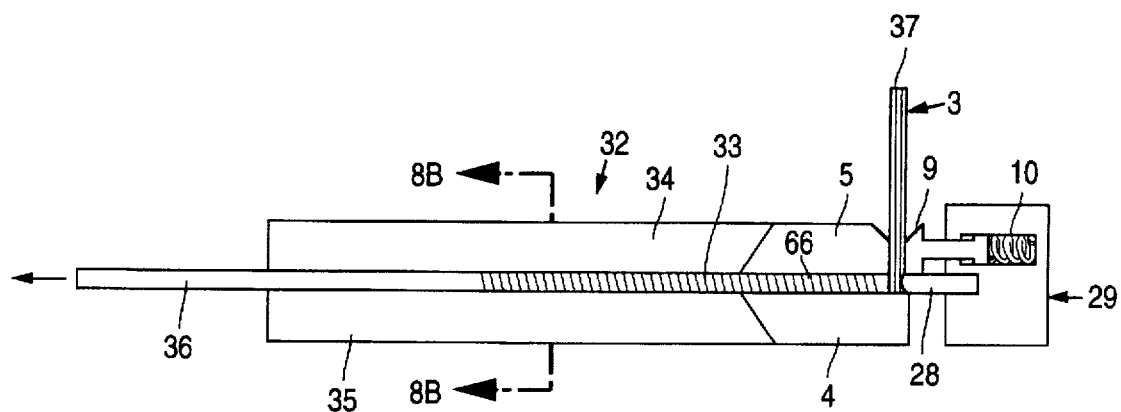
FIGS. 8A to 8C are cross-sectional views of the shear/extruder apparatus and mold used for vertical consolidation of the film.
Figure 8B:
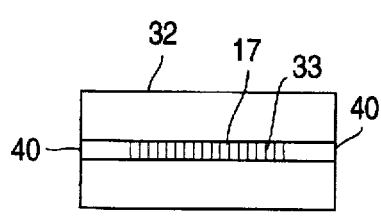
Figure 8C:
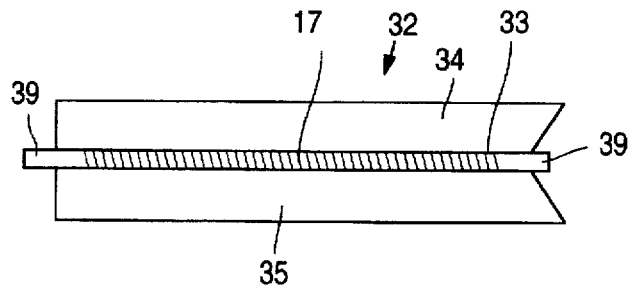

FIGS. 8A to 8C illustrate an apparatus for consolidating the film 100. The film leaving the extrusion slot 66 is fed directly into the slot 33 of a consolidation mold 32 consisting of a top plate 34, a bottom plate 35, and compressible slot spacers 40 that act as side walls. A spacer ram 36 provides back pressure on the film material as it is fed into the mold slot 33. As shown in FIG. 8C, after enough film is placed in the mold 32, it is removed from the end of the extrusion slot 66. The spacer ram 36 is removed and a pair of mold dams 39 are inserted into the ends of the compressible mold slot 33. The mold is then put in a press where the film is compressed. Shims may be inserted into the slot 33 to control the final thickness of the film. For gaskets that require pressure sensitive adhesive (PSA) properties, a PSA adhesive can be coated on the surfaces of the mold before the film is fed in, or the PSA adhesive can be coated on the gasket after the film is cured, or a matrix material can be chosen that has PSA properties on its own.

Figure 9A:
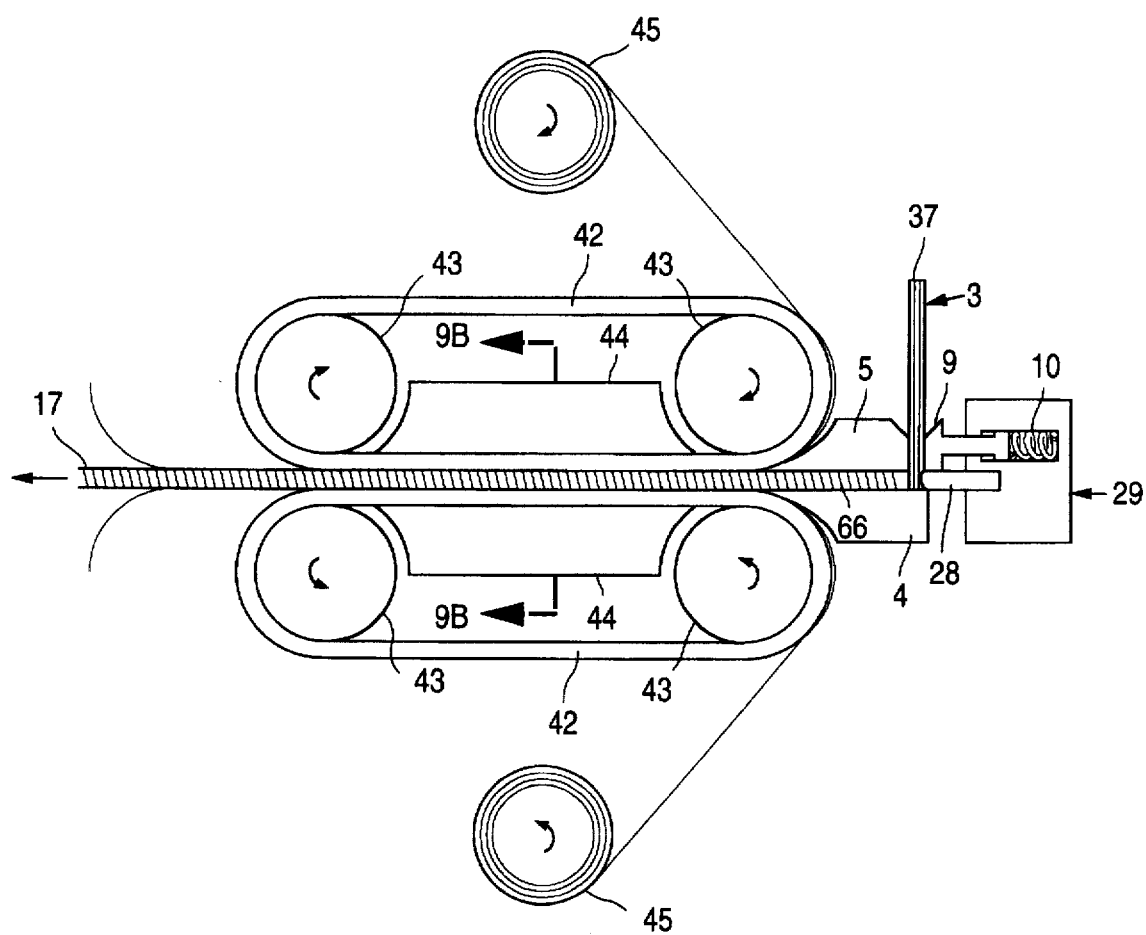
FIGS. 9A to 9B are side cross-sectional views of the shear/extruder apparatus with a belt assembly for vertical consolidation.
Figure 9B:
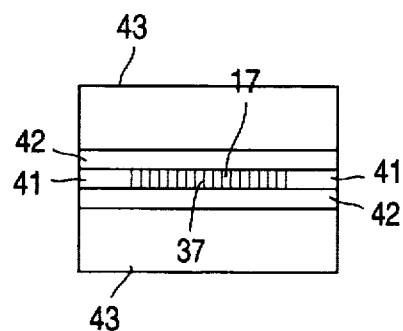

FIG. 9A and 9B show another apparatus for consolidating a long length sheet coming out of the extrusion slot 66. Belts 42 driven by rollers 43 form movable top and bottom walls to slot 37 formed therebetween. The sides of the slot 37 are formed by compressible belt spacers 41 that are on the outside edges of one of the belts 42. Pressure, and heat if necessary, are applied to the belts by heat/pressure blocks 44. The pair of opposing back rollers 43 (furthest from the ram assembly 29) are closer together than the front rollers 43 thereby applying a compressive squeezing action to the film as it travels down slot 37. If necessary, a release film 45, common to the production of composite films, can be introduced as the film exits the extruder slot 66. This release film 45 can be removed after the film exits slot 37 or before the film is fabricated into a thermal joint. The elastomeric gasket version of the invention is cured either in the belted area or after it exits this compaction process.

Figure 10A:
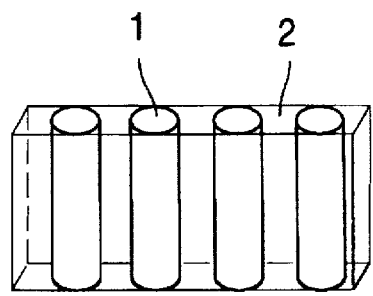
FIGS. 10A to 10F are top views of various types of prepreg that can be used with the shear/extruder apparatus of the present invention.
Figure 10B:
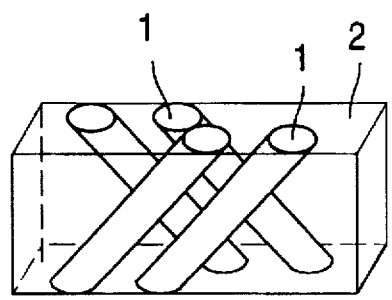
Figure 10C:
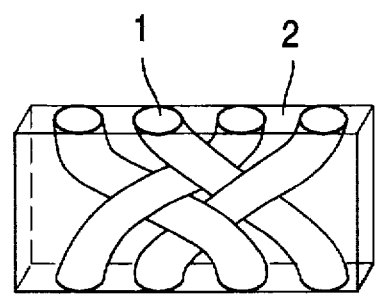
Figure 10D:
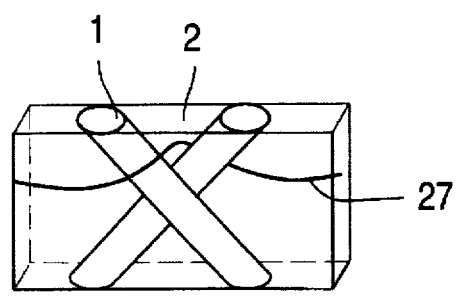
Figure 10E:
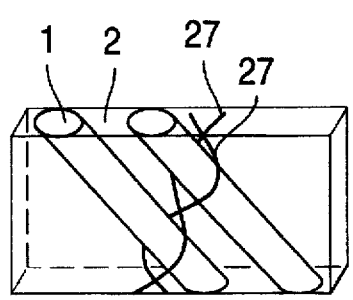
Figure 10F:
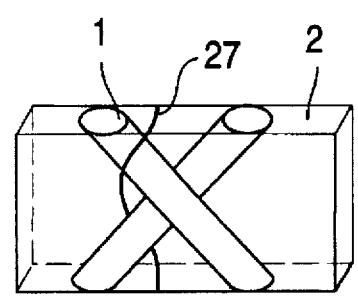

The desired fiber-to-film surface angle θ can be achieved in several ways. For Example, the fiber angle can be altered in the prepreg before manufacture into the joining film 100. FIGS. 10A to 10F show various angled fiber forms that can be made into prepreg 3. In FIG. 10A, unidirectional fibers 1 run the length of the prepreg sheet 3 held in place only by the matrix 2. In FIG. 10B the fibers 1 form two separate, cross directional, layers running across the prepreg 3, which is held together by the matrix 2. In FIG. 10C a bi-angular woven fabric is shown, where the weave pattern of the fibers holds them together. In FIG. 10D a triaxial woven fabric is shown with the fill direction made with a low modulus weaving filament 27 to hold the conductive fibers 1 together. In FIG. 10E a leno weave is shown with the warp direction comprised of low modulus weaving filaments 27. In FIG. 10F a triaxial fabric is shown with the warp direction comprised of a low modulus weaving thread 27. The possibilities for orientated fiber forms are not limited to these examples.

Figure 11A:
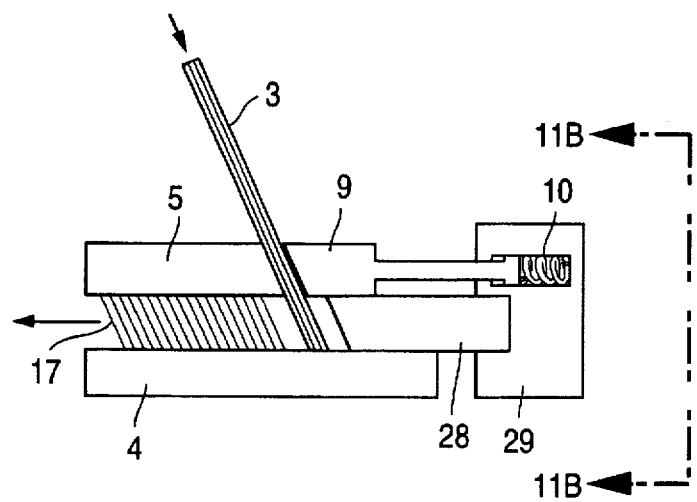
FIG. 11A is a cross-sectional side view of the prepreg being fed into the shear/extruder apparatus at a predetermined angle.
Figure 11B:
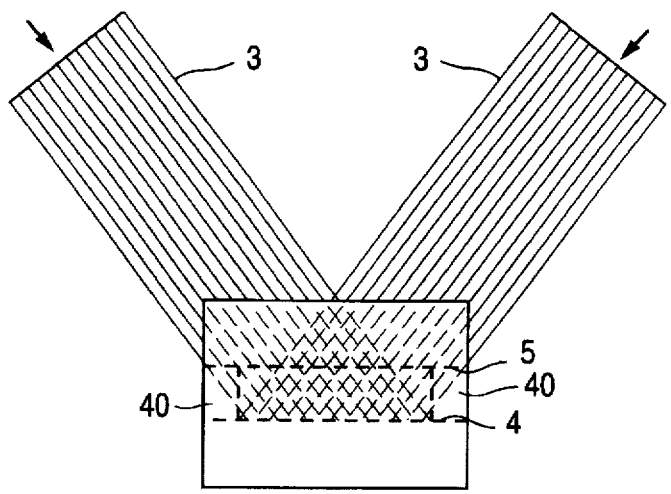
FIG. 11B is a cross-sectional end view of the prepreg being fed into the shear/extruder apparatus at predetermined angles.

The fiber-to-film surface angle θ can also (or further) be affected by introducing the prepreg 3 into the shear/extruder apparatus at an angle, either in the forward direction as illustrated in FIG. 11A, or in a sideways direction (from either side) as illustrated in FIG. 11B. The die blocks 4/5 and/or the side guides 60 can be specially formed to aid feeding the prepreg 3 into the shear/extruder apparatus 101 at the desired angle to produce the desired fiber-to-film surface angle θ for the film exiting the extruder slot 66.

Figure 12:
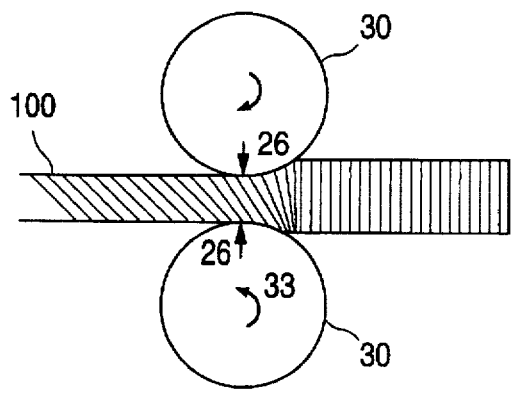
FIG. 12 is a side view of the nip roll assembly used to alter the fiber-to-surface angle of film.

The fiber angle θ can also (or further) be altered by processing film 100 after it leaves the extrusion slot 66. FIG. 12 shows a nip roll squeezing process that is used to alter the fiber angle θ. The film 100 is fed into two nip rolls 30 while in a softened state with a gap 26 between the rolls 30 that is less than the starting thickness of the film. The top roller runs at a slightly faster speed than the bottom roller's speed which results in a shearing action that realigns the fibers 1 to a greater angle θ within the film having a smaller thickness.

The minimum thickness of the joining film 100 is limited by how thin the ram blade 28 can be made before it starts to buckle under the pressure required to make the film. Under the right conditions, this thickness could be as low as 0.025 mm (0.001 in). The maximum thickness is limited by the fiber column stiffness needed for the spearing mechanism. The preferred thickness range for the film 100 is 0.025 mm (0.001 in) to 1 mm (0.039 in), which is ideal for joining films used in bonded and gasketed thermal joints.

The film 100 of the present invention provides superior local compression for making intimate contact with the entire joint surfaces while providing superior thermal conductivity. The film 100 also has the advantage that it can be made from a matrix materials that are processed at a low temperature but still achieve high thermal conductivity. The low processing temperature reduces CTE stress in bonded thermally conductive joints. The film can also be made from a low modulus material, with the fibers 1 configured to minimize in-plane stiffness, thereby giving the film a low in-plane modulus. The film offers an increase in thermal conductivity great enough that in many cases it is possible to allow an increase in joint thickness while still achieving the same or lower thermal resistance. These properties can be used in combination to optimally minimize CTE stress. Lastly, the film can be made of materials requiring a low joining pressure, thus reducing mechanical stress applied to the joint surfaces during joint fabrication.

Figure 13A:
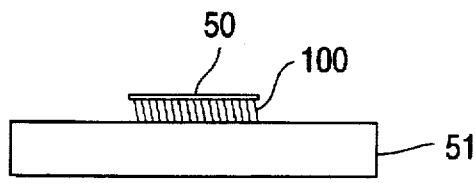
Figure 13D:
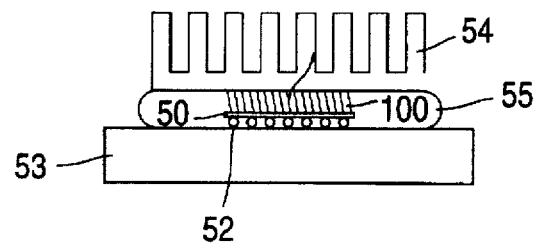
Figure 13C:
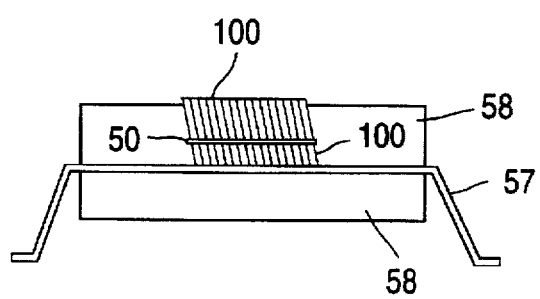
Figure 13E:
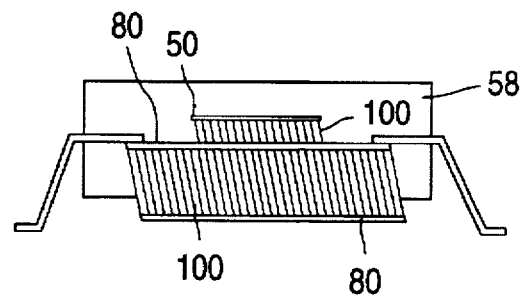
Figure 13D:
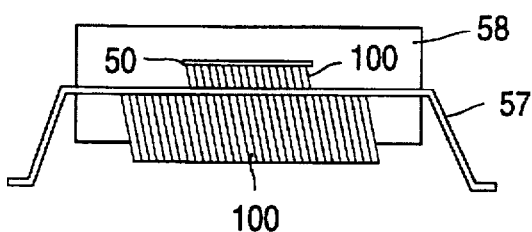

FIGS. 13A to 13E illustrate several applications of the joining film 100 of the present invention. FIG. 13A shows a semiconductor device 50 die bonded by the film 100 to a heat sink 51. FIG. 13B shows a semiconductor device 50 directly attached to a printed circuit board 53 by a ball grid array (BGA) of solder balls 52. A heat flow path is provided out of the device by the film 100, that directly thermally connects the device 50 with a heat fin 54. An underfill 55, common to BGA packaging, seals off the device. FIG. 13C shows the film 100 being used as a self-bond heat sink 56 on top of device 50, where the film 100 takes the place of a heat sink, typically a copper slug, to provide a heat path to the outside of an electronic package. The device 50 is also bonded underneath by film 100 to its lead frame 57. A typical plastic package 58 is molded in place to complete encapsulation of the device. For bonding a thermally conductive film to a single surface for use as a heat sink, as illustrated in FIG. 13C, a release film or agent can be used on a plate that presses the film 100 onto the semiconductor device. Alternately, a cooled plate can be used. FIG. 13D shows the film 100 on the opposite side of the lead frame 57 from where the device 50 is bonded by the film 100. FIG. 13E shows the film being used between two copper foils 80. The device 50 is bonded by the film 100 onto the inner copper foil 80.

Figure 14A:
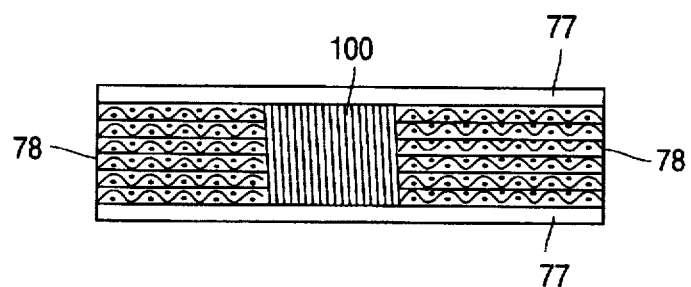
FIGS. 14A to 14B are side views of other applications of the thermally conductive fiber of the present invention.
Figure 14B:
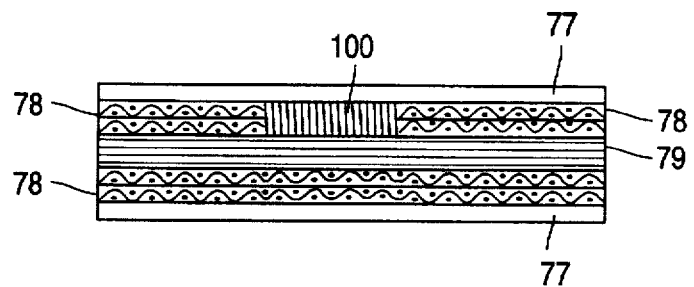

FIGS. 14A and 14B show the film 100 applied to PWB thermal vias. In FIG. 14A the film 100 is used to establish a top to bottom thermal pathway. It is cured at the same time as the PWB fiberglass laminate 78. The copper cladding 77 is bonded in the same laminate process or plated on later. In FIG. 14B the film 100 thermally connects the PWB surface with a thermally conductive plane 79 of film 100 in the center of the PWB, where the orthogonally oriented films 100 mesh together where they meet.

The preferred embodiment of the shear/extruder apparatus 101 of the present invention is discussed below. Before shearing, the prepreg 3 can be clamped with any material and force that will properly hold it in place for shearing, but will allow it to be pushed up as the sheared piece is pushed into the slot. Smooth steel faced clamp bars are preferred. A prepreg clamping force of between 0.069 and 3.45 MPa (10 and 500 psi) is preferred, which adequately allows the prepreg 3 to move up during the shearing process.

The ram blade 28 can be of any material that will shear the prepreg 3 and push the sheared pieces 16 down the slot 66. Hardened steel is preferred. The unsupported length of the ram blade must be short enough that it will not buckle under the shearing and pushing loads. The ram blade angle $\phi$ is preferred to be greater than 0° but not great enough to cause too deep a shear fracture line. The ram blade thickness must be no greater than the thickness of the slot and is preferred to be thinner by no more than 0.013 mm (0.0005 in).

The anti-friction surfaces 11 that guide and support the ram blade 28 can be any surface that prevents gauling and does not cause adverse contamination of the film being made. Coating with a dry lubricant such as graphite powder or a dry lubricant film is preferred. The anti-friction surfaces 11 must be close enough together and correctly aligned so that the ram blade 28 can not hit the top of the slot 66.

The materials of the extrusion slot 66 can be any that will stand-up to the forces and wear of the shear/extrusion process. The top and bottom die blocks 4/5 are preferred to be steel harder than the ram blade 28. The inner surfaces can be chrome plated. It is preferred that the inner surfaces be flat within ±0.005 mm (0.0002 in). The walls 65 of the slot 66 can be separate sheets of material or machined into one of the slot die blocks. They are preferred to have a thickness that causes the slot thickness to vary no more than ±0.013 mm (0.0005). They must allow the ram blade 28 and the film material to fit into the slot 66 and are preferred to leave an edge gap of no more than 0.5 mm (0.02 in).

The mold plates 34/35 for film consolidation can be made from any material that will stand-up to the vertical consolidation process. Steel or aluminum are acceptable. The surface accuracy requirements are preferred to be the same as the extrusion slot die blocks 4/5. The slot spacers 40 and mold dams 39 can be made out of any material that can compress adequately during the consolidation process, yet be rigid enough to contain the film. Teflon is an acceptable material.

The consolidation belts 42 can be commonly available metal belts. The belts 42 preferably have a thickness tolerance of ±0.005 mm (0.0002 in). The belt spacers 41 have the same requirements as the slot spacers 40 and mold dams 39 above. Teflon is again an acceptable material. It is preferred that the belt spacers 41 be bonded to one of the plates or fit with enough tension that they will stay in place. The belt rollers 43 should maintain the belts 42 under a preload tension of 14 to 70 MPa (1,000 to 10,000 psi), and be accurate enough to maintain a gap between the belts 42 of ±0.025 mm (0.001 in). The gap should also be adjustable on the rollers. The rpm speed ratio between the rollers and the ram blade cycle is preferred to be controllable within 1%. The heater/pressure blocks 44 should deliver enough heat and pressure to the belts 42 to allow consolidation and cure of the film into a gasket, if necessary. Steel or aluminum heated with hot oil channels or electric heaters is acceptable. Pressure can be supplied by numerous clamping arrangements such as springs or hydraulic equipment. Lubricant or an anti-friction surface is preferred between the blocks 44 and the belts 42. If release film 45 is required, it can be any of the films used for making composite prepregs, adhesive films or elastomeric sheets, such as silicone polymer coated papers, polyethylene films and polyimide films.

It is preferred that all of the metal surfaces the film materials come in contact with during the production of the film 100 be coated with a mold release agent, such as Chem-Trend Inc.'s MONO-COAT® E91 NODS.

A thermally conductive film 100 of the present invention has been produced using the extruder apparatus 101, as described below.

Figure 4A:
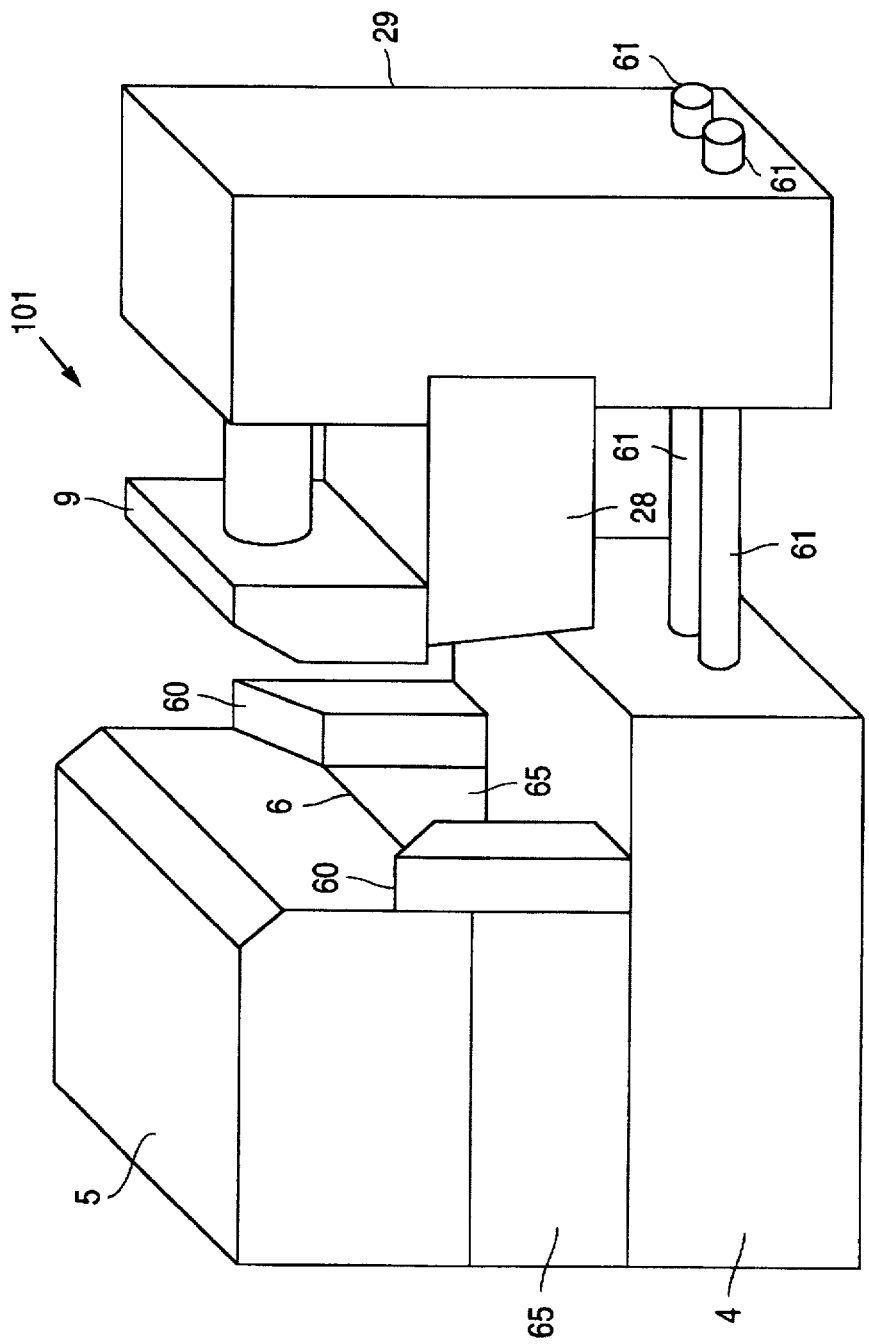
FIG. 4A is a perspective view of the shear/extrusion apparatus of the present invention.
Figure 4B:
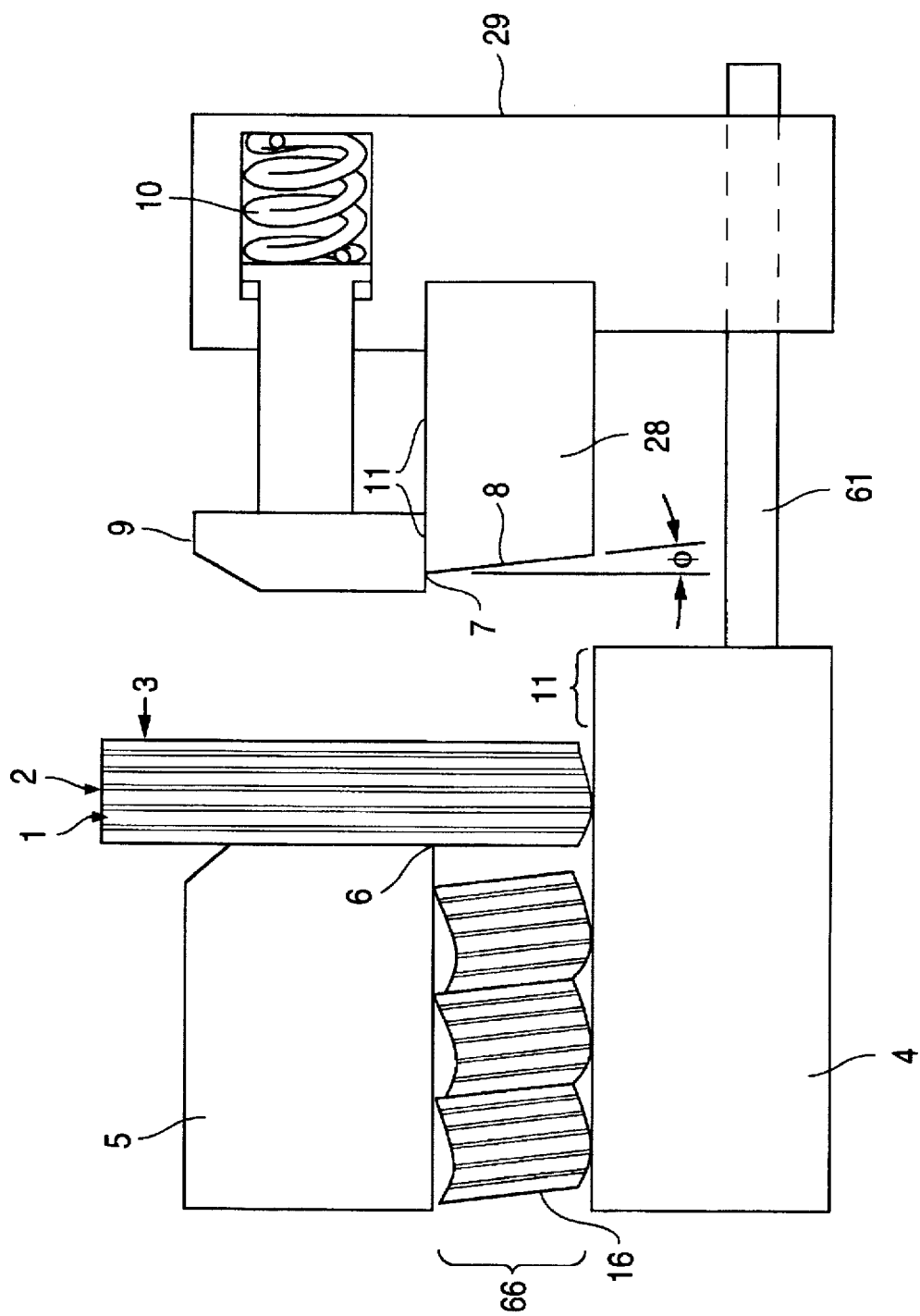
FIG. 4B is a side cross-sectional view of the shear/extrusion apparatus of the present invention.

A shear/extruder apparatus as illustrated in FIG. 4A was prepared, where the extrusion die blocks 4/5 were made from D2 tooling steel with heating/cooling channels drilled through them. They were then hardened to 53–58 RC (Rockwell C). The interior surfaces were surface ground to a flatness with a variation of less than ±0.005 mm (0.0002 in). These surfaces were polished with 600 grit polishing compound. Side walls 65, a spacer ram 36, and a ram blade 28 were cut from the same sheet of spring steel that had a specified hardness of 48–51 RC. The side walls 65 were shims that were surface ground to a thickness of 0.530±0.005 mm (0.0210±0.0002 in). The ram blade 28 and a spacer ram 36 were ground to a thickness of 0.523±0.005 mm (0.0206±0.0002 in). The ram blade 28 was prepared with a ram blade angle $\phi$ of 2.1°. The clamp bar was made from unhardened O1 steel and surface ground. Springs 10 were provided to give a clamping pressure of 0.77 to 0.94 MPa (112 to 137 psi) as the ram blade 28 contacted the prepreg 3. Graphite powder lubricant was placed between the bottom of the ram blade and the top of the bottom die block 4. Graphite powder was also placed between the top of the ram blade and the bottom of the clamp bar 9. All of the metal surfaces that would be in contact with the film material were coated with MONO-COAT® E91-N-ODS and heated to at least 100° C. for 5 minutes. The ram blade 28 was set to cycle back and forth 1.45 mm (0.057 in) with a travel into the extrusion slot of 1.27 mm (0.050 in). The spacer ram 36 was put in the extrusion slot to allow short experimental runs.

The following epoxy resin combination was selected for the prepreg matrix material, which would provide for a processing temperature for the finished film of 177° C.:

48.0 parts cresol novolac epoxy (Ciba Geigy: ECN 1873)

17.0 parts bis F novolac epoxy (Dainippon Ink and Chemicals: Epiclon 830) 17.0 parts phenoxy resin thermoplastic (Phenoxy Associates: Paphen™ PKHP)

18.8 parts 4,4'diaminodiphenylsulphone (Ciba Geigy micronized HT9664)

The matrix material was formed using the following steps:

1) The epoxies were melted together at 163° C.

2) The phenoxy was melted into this mixture at 171° to 179° C.

3) This mixture was cooled to 163° C. and the DDS was mixed in until the mixture turned a cloudy amber in appearance.

4) This mixture was spread on a release paper to cool.

5) This resin mixture was remelted at 94° C. and drawn into a film.

The film was flexible at room temperature if bent slowly. It fractured easily if bent with a sharp motion. Examination at various temperatures revealed that it started to soften at 40° C. and did not completely melt until 92° C. was reached.

The following thermally conductive fiber was selected:
coal tar pitch-based carbon fiber
Mitsubishi Chemical: K13C2U, Grade: 01101 P2001
thermal conductivity: 610 W/m·° K
tensile modulus: 923,7545 MPa (134 psi)
fiber diameter: 0.001 cm (0.0004 in)
fiber form: 2,000 fiber count, long length yarns Parallel strands of this fiber were attached to a frame and impregnated with the epoxy resin film at 155° C. Three pieces of prepreg were produced with fiber volumes of 18, 26, and 35%.

The front end of the shear/extruder 101 was enclosed in a plastic film enclosure with desiccant bags inside to keep it dry. The ram assembly end of the shear/extruder was cooled to 2° C. The ram assembly was set to a cycle rate of 100 cycles per minute. In three separate runs, the pieces of prepreg were fed in to the machine until each produced sufficient film for a test sample. The machine was stopped and the extrusion die blocks 4/5 were raised to a temperature of 65° C. The die blocks were cooled and the film removed.

In all three runs a film was removed that looked like the material in FIG. 7B with a slight off axis fiber angle. Light could be shined through the films allowing a microscopic examination that showed very few broken or out of place fibers. The fibers had a fiber-to-film surface angle θ of 88° as determined by microscopically examining their broken edges, which corresponds to the 2.1° angle φ of the ram blade face 8. The thickness between the fracture surfaces was determined by measuring the broken edges under a microscope. This measurement was confirmed by dissolving the resin in solvent and measuring the washed out fiber lengths under a microscope. The measurement results were:

| fiber volume % | average thickness mm (in) | thickness range mm (in) | standard deviation mm (in) |
| --- | --- | --- | --- |
| 18 | 0.507 (0.0200) | 0.503–0.516 (0.0198–0.0203) | <0.007 (0.0003) |
| 26 | 0.507 (0.0200) | 0.488–0.526 (0.0192–0.0207) | <0.019 (0.0008) |
| 35 | 0.495 (0.0195) | 0.483–0.507 (0.0190–0.0200) | <0.012 (0.0005) |

The films were placed between two sheets of 0.018 mm (0.0007 in) thick Reynolds 8111 aluminum foil. Shims of 0.462 mm (0.0182 in) were placed on both sides of the specimens, between the foils. This assembly was spring clamped between two steel plates and put in an oven for curing. The specimens were raised to a temperature of 171° C. and cured for 90 minutes. Microscopic examination of broken edges and peeling off the foil of portions of these specimens indicated that the film had completely conformed to the foils on both sides and both ends of the fibers were in contact with foil. The fiber-to-film surface angle θ was reduced further below 88° during this operation.

Disks with a diameter of 12.7 mm (0.5 in) were prepared from the specimens and tested for thermal conductivity using a laser flash test. The specimens were exposed to a pulse of laser light on one side and the temperature rise was recorded as a function of time. Using this data, coupled with the heat capacity for the fiber and the resin, a thermal conductivity for the test film was calculated while taking into account the effects of the aluminum foil. The results were:

| fiber volume (%) | thermal conductivity (W/m °K.) |
| --- | --- |
| 18 | 79.9 |
| 26 | 101 |
| 35 | 154 |

It is to be understood that the present invention is not limited to the embodiments described above and illustrated herein, but encompasses any and all variations falling within the scope of the appended claims.

What is claimed is:

1. A thermally conductive film, comprising:

a film of polymeric matrix material having a thickness t defined between a top surface and a bottom surface;

a plurality of fibers, having a greater thermal conductivity than said polymeric matrix material, disposed in said film extending between said top surface and said bottom surface, each of said fibers is oriented in said film to form a fiber-to-film surface angle θ relative to said top and bottom surfaces that is greater than about 45° but is less than arctan t/d, where t is said thickness of said film and d is the diameter of said fibers in the direction of said angle θ.

2. The thermally conductive film of claim 1 wherein said fibers disposed in said film are substantially parallel to each other.

3. The thermally conductive film of claim 1 wherein said matrix material is capable of permanent deformation in the direction of said thickness t to the extent that the ends of said fibers reach said top and bottom surfaces.

4. The thermally conductive film of claim 1 wherein said matrix material is capable of local deformation in the direction of said thickness t to allow at least one of said fibers to tilt in a direction of a smaller angle θ in response to a local compressive force.

5. The thermally conductive film of claim 1 wherein said matrix material is an elastomeric material.

6. The thermally conductive film of claim 1 wherein said matrix material has an adhesive property.

7. The thermally conductive film of claim 1 further comprising:

a coating formed on said plurality of fibers to modify at least one of the reflectivity, electrical conductivity, and the energy absorption properties of said fibers.

8. The thermally conductive film of claim 1 wherein at least some of the plurality of fibers are light transmissive fibers.

* * * * *